United States Patent
Gabriel (10) Patent No.: US 9,503,155 B2
(45) Date of Patent: Nov. 22, 2016

(54) TUNING ASYMMETRY OF A DIFFERENTIAL DIGITAL INTERFACE TO CANCEL MAGNETIC COUPLING

(71) Applicant: NXP B.V., Eindhoven (NL)

(72) Inventor: Niels Gabriel, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/682,904

(22) Filed: Apr. 9, 2015

(65) Prior Publication Data

US 2016/0301446 A1 Oct. 13, 2016

(51) Int. Cl.
*H04B 1/10* (2006.01)
*H04B 3/32* (2006.01)
*G01R 27/26* (2006.01)

(52) U.S. Cl.
CPC ............ *H04B 3/32* (2013.01); *G01R 27/2611* (2013.01)

(58) Field of Classification Search
USPC .......................................... 455/130, 295, 296
See application file for complete search history.

(56) References Cited

U.S. PATENT DOCUMENTS

| | | | | |
|---|---|---|---|---|
| 7,565,120 B2* | 7/2009 | Igarashi | ................... | H04B 1/30 455/130 |
| 8,682,275 B2* | 3/2014 | Kerth | ..................... | H04B 15/00 455/295 |
| 8,909,161 B2* | 12/2014 | Din | ........................ | H04B 1/525 455/130 |
| 8,983,379 B2* | 3/2015 | Kim | ..................... | H04B 5/0031 455/296 |
| 2012/0153927 A1* | 6/2012 | Wolfus | ..................... | H01F 3/10 323/310 |
| 2013/0169292 A1 | 7/2013 | Yun et al. | | |
| 2014/0269947 A1* | 9/2014 | Schneider | ................ | H04B 3/32 375/257 |
| 2016/0169717 A1* | 6/2016 | Zhitomirsky | ............ | G01D 5/20 702/94 |

OTHER PUBLICATIONS

Chen, Yinchao et al: "Frequency and Time Domain Crosstalk Signal Analysis for Integrated High-Density Circuits"; Intelligent Systems, 2009. GCIS '09. WRI Global Congress on, IEEE; Piscataway, NJ, USA; pp. 334-337; (May 19, 2009).
Extended European Search Report for Patent Appln. No. 16164367.1 (Sep. 29, 2016).
Luong, Duc Long, et al: "Crosstalk Analysis and Measurement Technique for High Frequency Signal Transfer in MEMs Probe Pins"; IEICE Transactions on Electronics, Institute of Electronics, Tokyo, JP, vol . E95C, No. 9; pp. 1459-1464 (Sep. 2012).
Strle Drago;"Reduction of Crosstalk in Mixed Signal Integrated Circuits", VLSI Technology, Systems, and Applications, 1997. Proceedings of Technical Papers. 1997 International Symposium on, IEEE; pp. 74-78; (Jun. 3, 1997).

* cited by examiner

*Primary Examiner* — Adam Houston (57) ABSTRACT

An integrated circuit including: an RF input/output; an on-chip digital interface including a plurality of IC pin connections wherein an output current from the on-chip digital interface is split into first and second parallel paths among the plurality of IC pin connections; first and second current sources; and a controller, wherein the controller is configured to determine a plurality of mutual inductances between the plurality of IC pin connections and the RF input/output; calculate a current ratio n based upon the plurality of mutual inductances between a first current driven on the first parallel path and a second current driven on the second parallel path; drive the first current source to produce the first current and the second current source to produce the second current wherein the first and second current have the determined ratio n; and measure a voltage at the RF input/output.

21 Claims, 6 Drawing Sheets

TUNING ASYMMETRY OF A DIFFERENTIAL DIGITAL INTERFACE TO CANCEL MAGNETIC COUPLING

TECHNICAL FIELD

Various embodiments disclosed herein relate generally to cancellation of magnetic coupling for a digital interface.

Digital interfaces on a tuner integrated circuit (IC) may be both continuously running and high speed. Reception sensitivity at an antenna input may become degraded by cross-talk from the digital interface. A dominant coupling mechanism for cross-talk may be magnetic coupling.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of an embodiment adequate to allow those of ordinary skill in the art to make and use the inventive concepts will follow in later sections.

Various embodiments relate to a non-transitory medium comprising instructions configured to execute a method of cancelling cross-talk on IC pin connections of a chip, the non-transitory medium including: instructions for driving a first current source to produce a first current at a first pair of IC pin connections of the chip and a second current source to produce a second current at a second pair of IC pin connections of the chip, wherein n is the ratio of the first and second currents; instructions for measuring a voltage at an input of the chip when the first and second current sources are driven; instructions for repeating the instructions for driving a first current source to produce a first current and a second current source to produce a second current and instructions for measuring a voltage at an input of the chip when the first and second current sources are driven for various values of n; instructions for determining the value of n that the produces the minimum voltage magnitude at the input/output of the chip.

Further, various embodiments relate to a non-transitory medium comprising instructions configured to execute a method of cancelling cross-talk on IC pin connections of a chip, the non-transitory medium including: instructions for determining a first mutual inductance between a first IC pin connection and a fifth IC pin connection; instructions for determining a second mutual inductance between a second IC pin connection and a fifth IC pin connection; instructions for determining a third mutual inductance between a third IC pin connection and a fifth IC pin connection; instructions for determining a fourth mutual inductance between and a fourth IC pin connection and a fifth IC pin connection; instructions for calculating a current ratio n based upon the first, second, third, and fourth mutual inductances, wherein the current ratio is the ratio between a first current driven on the first and second IC pin connections and a second current driven on the third and fourth IC pin connections; instructions for driving a first current source to produce the first current and a second current source to produce the second current wherein the first and second current have the determined ratio of n; and instructions for measuring a voltage at the fifth IC pin connection.

Further, various embodiments relate to an integrated circuit including: an on-chip digital interface including a plurality of IC pin connections, wherein an output current from the on-chip digital interface is split into first and second parallel paths among the plurality of IC pin connections; an RF input/output; a first and second current source; and a controller, wherein the controller is configured to calibrate the integrated circuit by: driving the first current source to produce a first current on the first parallel path and the second current source to produce a second current on the second parallel path, wherein n is the ratio of the first and second currents; measuring a voltage at an RF input/output of the chip when the first and second current sources are driven; repeating driving a first current source to produce a first current on the first parallel path and a second current source to produce a second current on the second parallel path and measure a voltage at an RF input/output of the chip when the first and second current sources are driven for various values of n; and determining the value of n that the produces the minimum voltage magnitude at the input/output of the chip.

Further, various embodiments relate to an integrated circuit including: an on-chip digital interface including a plurality of IC pin connections, wherein an output current from the on-chip digital interface is split into first and second parallel paths among the plurality of IC pin connections; an RF input/output; a first and second current source; and a controller, wherein the controller is configured to calibrate the integrated circuit by: determining a plurality of mutual inductances between the plurality of IC pin connections and the RF input/output; calculating a current ratio n based upon the plurality of mutual inductances, wherein the current ratio is the ratio between a first current driven on the first parallel path and a second current driven on the second parallel path; driving the first current source to produce the first current and the second current source to produce the second current wherein the first and second current have the determined ratio n; and measuring a voltage at the RF input/output.

BRIEF DESCRIPTION OF THE DRAWINGS

In order to better understand various embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art, and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. As used herein, the terms "context" and "context object" will be understood to be synonymous, unless otherwise indicated.

Figure 1:
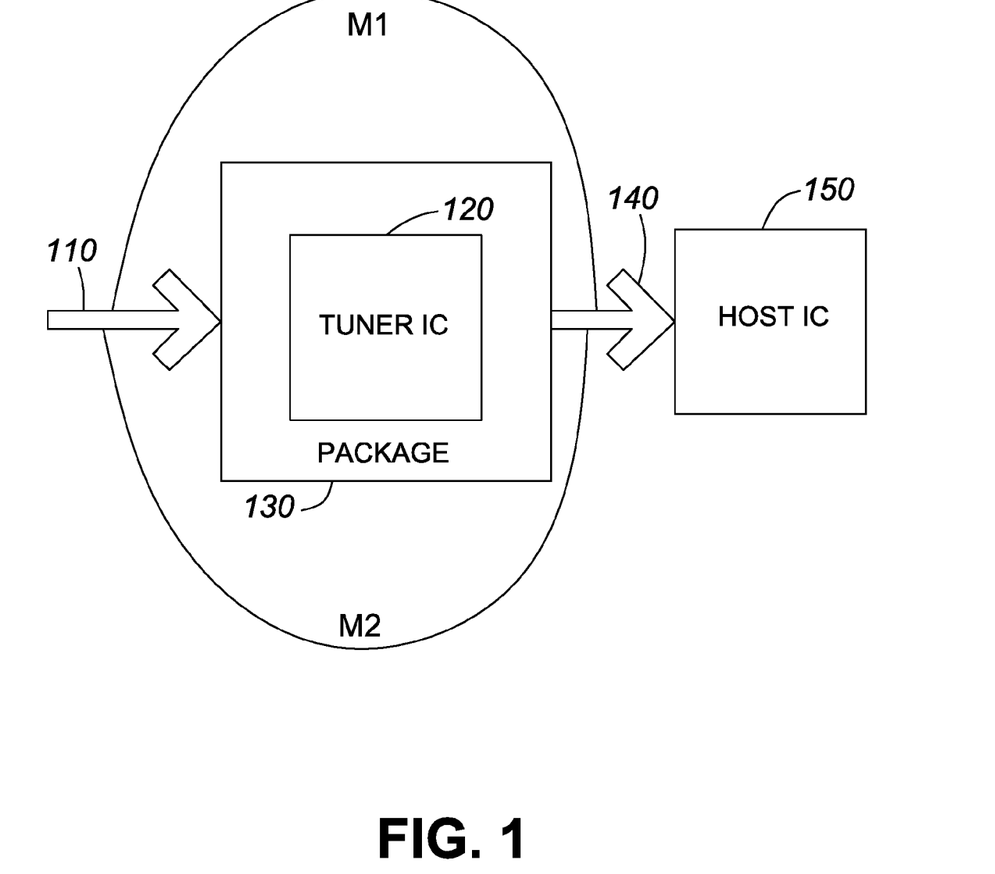
FIG. 1 illustrates a system including a high-speed serial interface (HSSI)

FIG. 1 illustrates a system 100 including a high-speed serial interface (HSSI). System 100 may include a single-ended input pin 110, a tuner Integrated Circuit (IC) package 130, a tuner IC 120, an output 140, and a host Integrated Circuit (IC) 150. The output 140 may be a differential output comprising both a positive output pin and a negative output pin.

Input 110 may receive an analog input signal. In an embodiment, an antenna may supply the analog input signal. Input 110 may send the analog input signal to a tuner IC package 130. In one embodiment, input 110 may be a single-ended pin. In another embodiment, input 110 may be either double-ended input pins or differential input pins. In a third embodiment, the tuner IC package 130 may be defined as the physical connection from input 110 towards a tuner IC 120.

Tuner IC package 130 may include a tuner IC 120. Tuner IC 120 may receive an analog input signal and may produce a digital output signal. In an embodiment, output 140 may receive the digital output signal from tuner IC 120.

Host IC 150 may be coupled to the output 140 and may receive digital data from tuner IC 120. In an embodiment, host IC 150 may have a resistance of 100Ω.

Mutual inductance is a measure for magnetic cross-talk. In an embodiment, mutual inductance M1, M2 may occur between either side of tuner IC 120. If output 140 is a differential output, mutual inductance M1 may produce interference between the digital output signal at a positive output and the analog input signal of input 110 and mutual inductance M2 may produce interference between the digital output signal at a negative output and the analog input signal of input 110.

When tuner IC 130 receives a signal from an antenna, the input signal may be relatively low in power. In this embodiment, the signal received from the antenna may be susceptible to interference from digital signals on output 140. This interference may reflect an imbalance in mutual inductance M1, M2 as measured by a voltage $V_{dig}$ at input 110.

For a frequency f and a current I, $V_{dig} = 2\pi f^* M1^* I - 2\pi f^* M2^* I$. The current I is the representation of the digital output signal. If output 140 is differential, the amplitude of the current I will be identical at both the positive and negative outputs pin, but the direction of the current I will be opposite at the respective differential outputs.

Suppose there is an imbalance between M1 and M2, where M1 is 100 pH while M2 is 90 pH. In that embodiment, $V_{dig} = 2\pi f^* 10$ pH*I. This voltage may be high enough to disrupt low power signals. Further details regarding mutual inductance will be described below in the context of FIG. 2.

Figure 2:
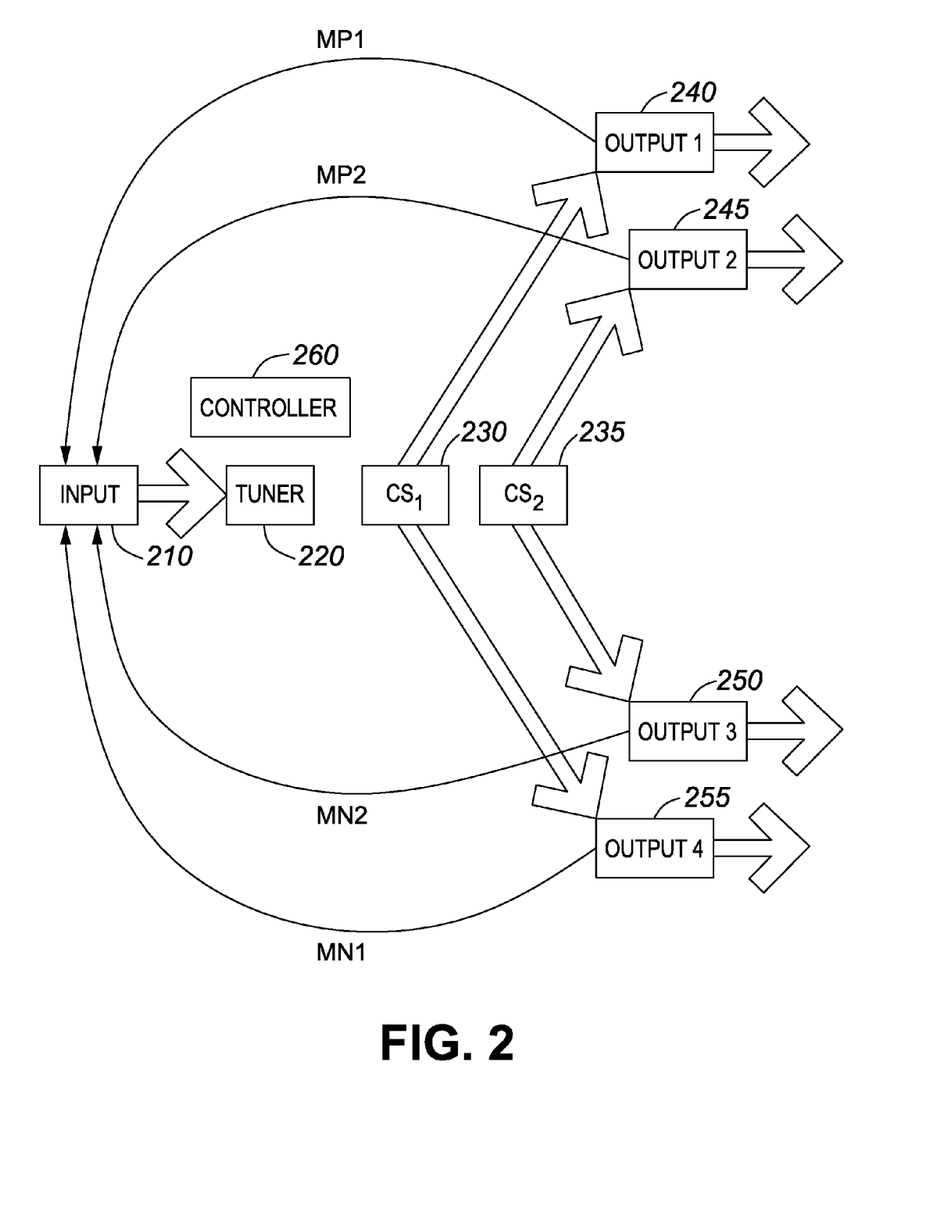
FIG. 2 illustrates an embodiment of a tuner IC package in FIG. 1.

FIG. 2 illustrates an embodiment of tuner IC package 130 in FIG. 1. Tuner IC package 130 may include an input IC pin connection 210, a tuner 220, a first current source 230, a second current source 235, output IC pin connections 240, 245, 250, and 255, and a controller 260. The input IC pin connection 210 and output IC pin connections 240, 245, 250, and 255 may have an inherent inductance as illustrated in FIG. 2. If 140 were an input instead of an output, current sinks could be used instead of current sources.

An input IC pin connection 210 may couple the analog input signal from input 110 to a tuner 220. The input IC pin connection 210 may be located within tuner IC package 130 but outside of tuner IC 120. In contrast, tuner 220 may be part of tuner IC 120.

The digital output side of tuner IC 120 may include a first current source 230 and a second current source 235. First current source 230 may be coupled to first output IC pin connection 240 and fourth output IC pin connection 255. Second current source 235 may be coupled to second output IC pin connection 245 and third output IC pin connection 250. The output IC pin connections 240, 245, 250, and 255 may be located within tuner IC package 130 but outside of tuner IC 120.

While this embodiment describes four output IC pin connections 240, 245, 250, and 255, other numbers of IC pin connections larger than two may be used.

A controller 260 may coordinate operations in tuner IC 120. In particular, controller 260 may control the operations of tuner 220, first current source 230, and second current source 235. Controller 260 may calculate current values for current source 230 and current source 235. Controller 260 may also calculate mutual inductance values.

In various embodiments, controller 260 may be an Application Specific Integrated Circuit (ASIC). In other embodiments, controller 260 may be a microprocessor, microcontroller, digital signal processor, etc. . . . The controller 260 may be part of the tuner IC 120, which may include a microprocessor, a microcontroller, a digital signal processor, and other devices.

As described in the context of FIG. 1, asymmetry in mutual inductance may produce a voltage in input 110. However, the asymmetry of mutual inductance between the various IC pin connections 240, 245, 250, and 255 may also be used to tune a first current source 230 and a second current source 235 in order to substantially cancel magnetic coupling into input IC pin connection 210. Such tuning involves adjustment of the current distribution, because the asymmetry of mutual inductance between IC pin connections 240, 245, 250, and 255 is fixed by the physical dimensions of the IC package. An equation for the voltage $V_{dig}$ at the junction between input 110 and input IC pin connection 210 may involve mutual inductance factors related to all of the IC pin connections 210, 240, 245, 250, and 255.

In an embodiment, the mutual inductance Mp1 between input IC pin connection 210 and first output IC pin connection 240 may be 100 pH. The mutual inductance Mpg between input IC pin connection 210 and second output IC pin connection 245 may be 95 pH. The mutual inductance Mn2 between input IC pin connection 210 and third output IC pin connection 250 may be 90 pH. The mutual inductance Mn1 between input IC pin connection 210 and fourth output IC pin connection 255 may be 85 pH.

The current applied to the output IC pin connections 240, 245, 250, and 255 may be split as described below. First, output IC pin connection 240 and fourth output IC pin connection 255 may have a current n*I, while second output IC pin connection 245 and third output IC pin connection 250 may have a current I. The value n, as described below, may be tuned. Based upon these differing currents, one may calculate voltage $V_{dig}$:

$$V_{dig} = 2\pi f^* Mp1^* I^* n + 2\pi f^* Mp2^* I - 2\pi f^* Mn2^* I - 2\pi f^* Mn1^* I^* n$$

The magnetic coupling to the input IC pin connection 210 can be tuned to zero by setting n equal to (Mn2−Mp2)/(Mp1−Mn1). For these mutual inductance values, n would be −⅓.

Such tuning may have many advantages. A digital interface type or protocol that is likely to create analog interference, such as Ethernet, may be selected and then tuned to coexist with analog tuners. Accordingly, requirements on IC pinning, layout, and package symmetry may be relaxed.

As an alternative, a dummy load resistance may be added to simplify the tuning process. In an embodiment, a first output driver may be used for data transmission from the tuner IC to the host IC, while a second output driver may be controlled by controller 260. By separating these functions, a standard digital interface block could be reused for data transmission, while, in parallel, a second circuit may cancel magnetic fields at IC pin connection 210.

As described above, current sinks could be used instead of current sources. In the current sink embodiment, variable current sinks may be implemented as variable resistors. Impedance of two variable resistors in parallel may result in a termination resistance of the digital interface, such as 100Ω.

Figure 3:
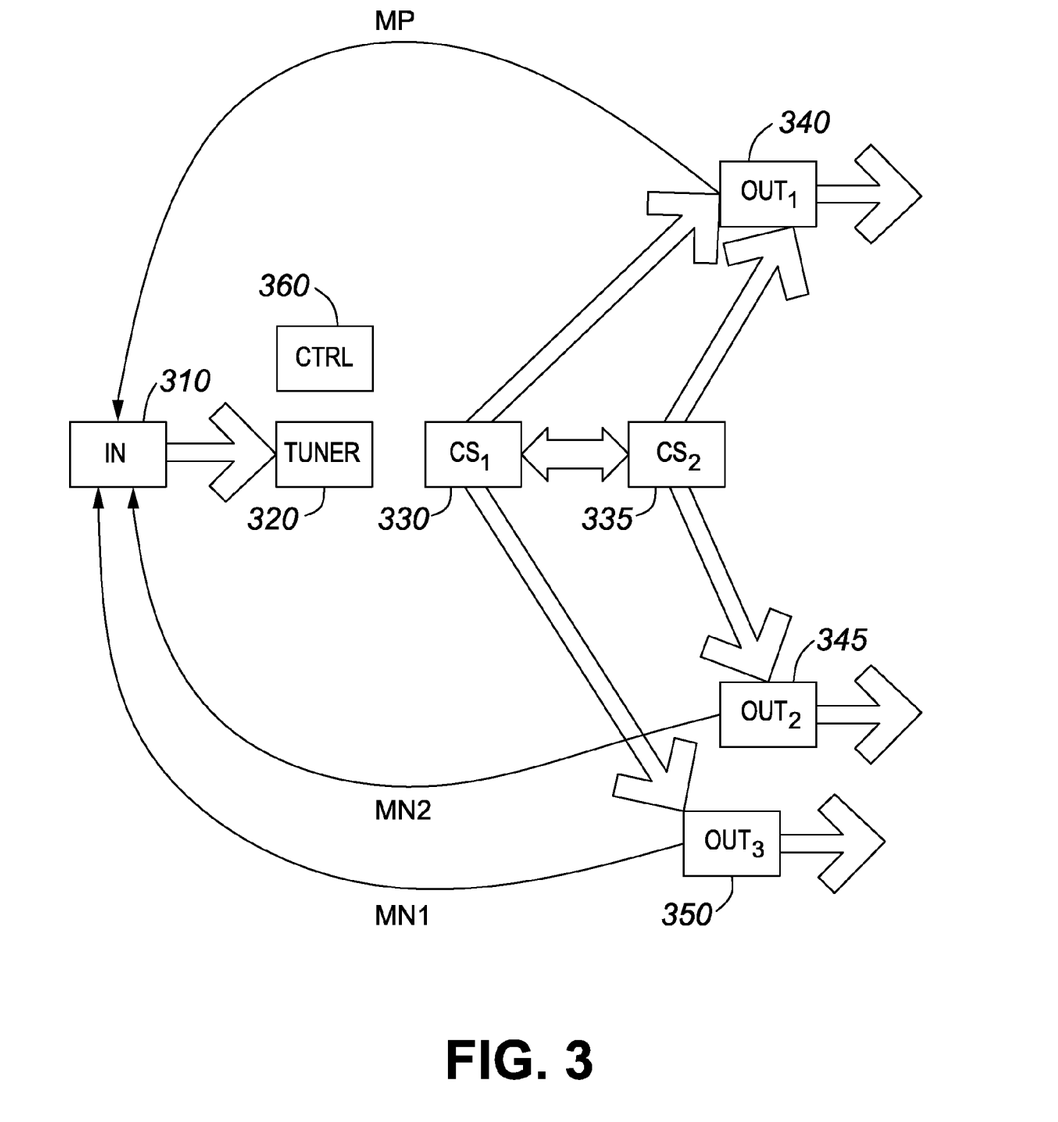
FIG. 3 illustrates a second embodiment of a tuner IC package in FIG. 1.

FIG. 3 illustrates a second embodiment of tuner IC package 130 in FIG. 1. Tuner IC package 130 may include an input IC pin connection 310, a tuner 320, a first current source 330, a second current source 335, output IC pin connections 340, 345, and 350, and a controller 260. Unlike FIG. 2, the second embodiment of FIG. 3 has three output IC pin connections 340, 345, and 350.

In FIG. 3 first current source 330 and second current source 335 may be internally connected. Current for the digital output may be divided across output IC pin connections 340, 345, and 350 in order to minimize interference to tuner IC package 130. While the second embodiment may not be as symmetrical as the first embodiment with four output IC pin connections, it may have a lower pin count.

Figure 4:
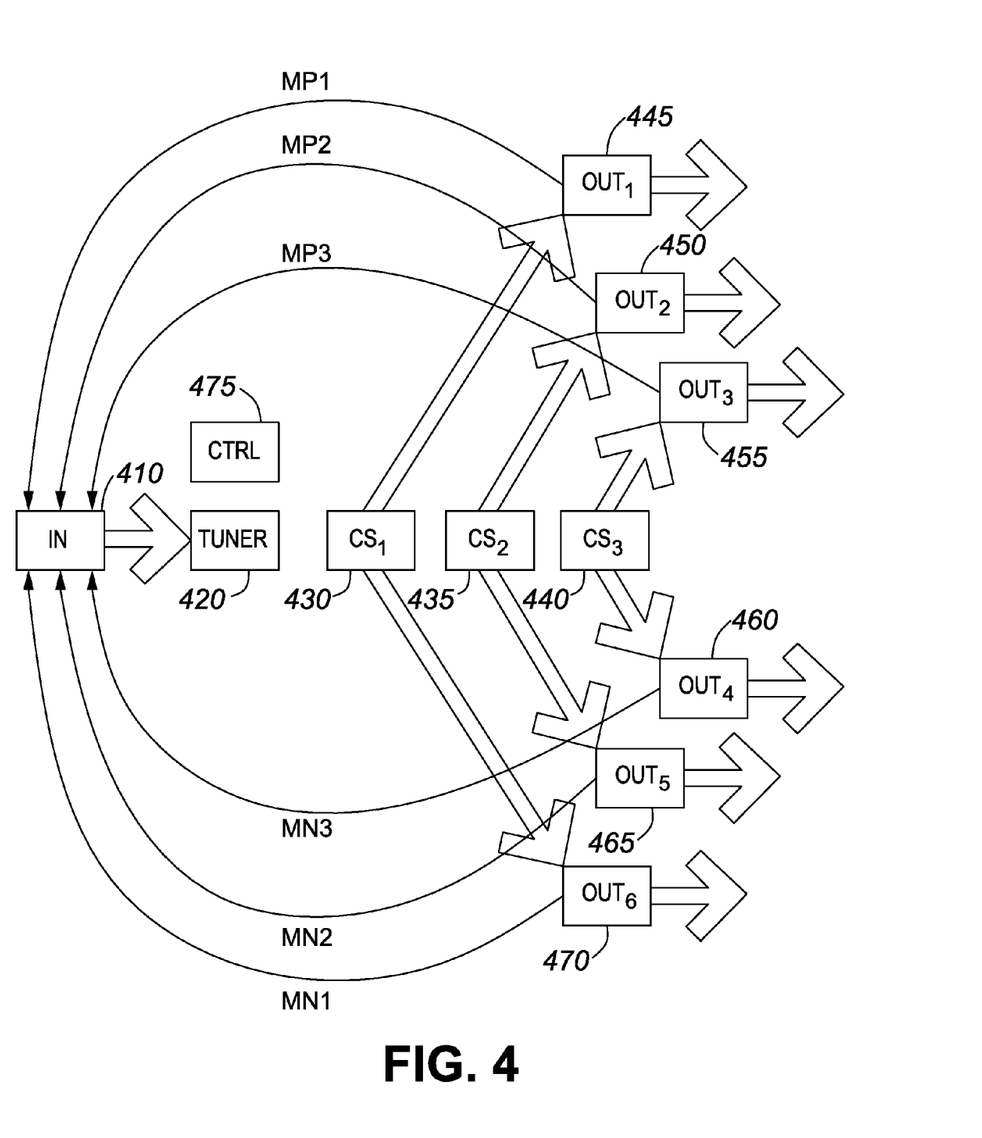
FIG. 4 illustrates a third embodiment of a tuner IC package in FIG. 1.

FIG. 4 illustrates a third embodiment of tuner IC package 130 in FIG. 1. Tuner IC package 130 may include an input IC pin connection 410, a tuner 420, a first current source 430, a second current source 435, a third current source 440, output IC pin connections 445, 450, 455, 460, 465, and 470, and a controller 475. Unlike FIG. 2, the second embodiment of FIG. 3 has six output IC pin connections 445, 450, 455, 460, 465, and 470.

In FIG. 4, an additional degree of freedom is available due to the extra pair of output IC pin connections compared to FIG. 2. Thus, it may be possible to compensate for cross-talk into a second antenna input. In further embodiments, the number of current sources could be scaled to compensate for more than two Radio Frequency (RF) inputs. In general, the total number of current sources would be one higher than the total number of RF inputs.

Figure 5:
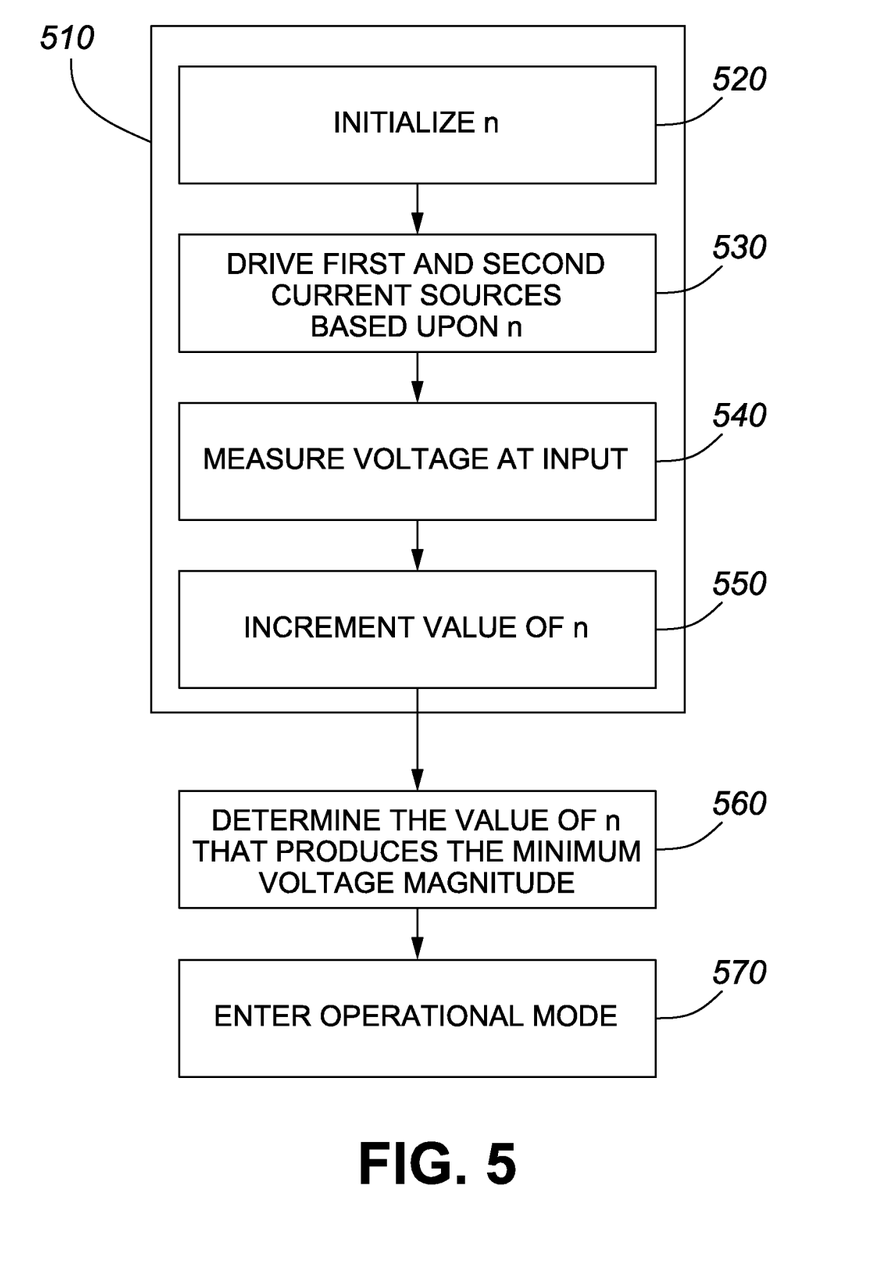
FIG. 5 illustrates an method of cross-talk cancellation.

FIG. 5 illustrates a method 500 of cross-talk cancellation. The method 500 may begin with a calibration step 510. The calibration step may include a number of steps as shown. First, the calibration has an initialization step 520 where an initial value for n is chosen. The driver current Id=I+I*n=I*(n+1) is the total current needed to drive the output that is split across the two output IC pin connections 240 and 245. Then, the first current source 230 may be commanded to produce a current of I while the second current source 235 may be commanded to produce a current of n*I 530. Next, the induced voltage at input 110 may be measured 540. The value of n and the induced voltage may be stored. Then, the method may increment the value of n 550 and return to step 530. If the incremented value of n reaches a specified maximum value, then the method proceeds to step 560. At step 560, the method 500 determines the value of n that produces the minimum voltage magnitude at input 110. Alternatively, as each voltage measurement is made at input 110, the method 500 may determine if the current voltage magnitude measurement is less than a previously determined minimum value. If so, the new voltage magnitude and its associated value of n may be stored.

At this point, the value of n may be further refined, by selecting a range of values for n about the value of n that provides the minimum magnitude voltage. Then, smaller increments for the value of n may be used to repeat the steps of 530-550 to produce a more refined value for n.

Next, the method places the tuner IC 130 in an operational mode 570, wherein the first current source 230 and the second current source 235 are driven based upon the value of n determined above. The method may then end at 580.

It is also noted that during the operation of the tuner IC 130, recalibration may occur. This may include a complete repeat of the calibration method, or just repeating the calibration for a range of n values around the currently used value of n. Also, intermittently during operation, the first current source 230 and the second current source 235 may be driven based upon n and a measurement of the induced voltage at the input 110. If the measured voltage exceeds a threshold value, then the tuner IC 130 may be recalibrated using, for example, the method 500.

Figure 6:
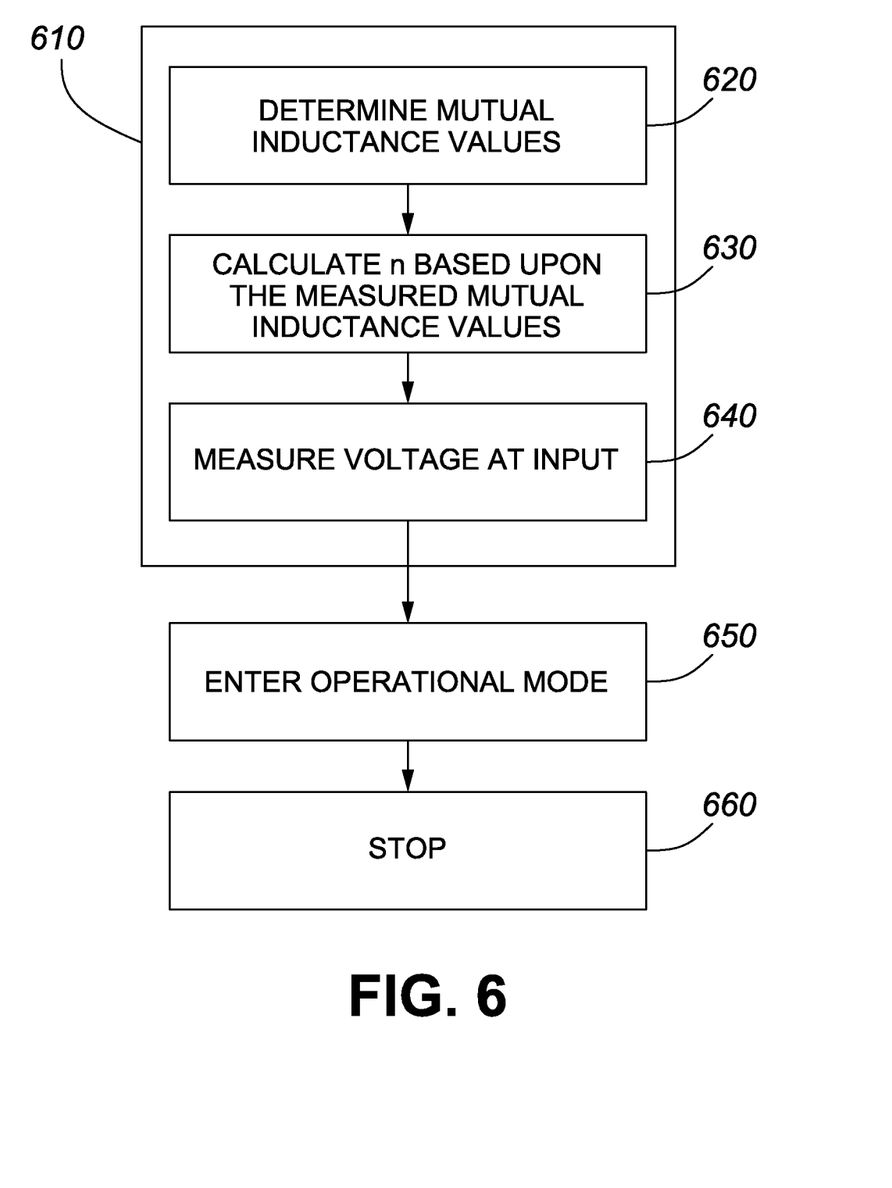
FIG. 6 illustrates another method of cross-talk cancellation.

FIG. 6 illustrates a method 600 of cross-talk cancellation. The method 600 may begin with a calibration step 610. The calibration step 610 may include a number of steps as shown. First, the calibration step 610 may determine the mutual inductance 620 between the various output IC pin connections, for example 240, 245, 250, and 255, and input 110. This measurement of the mutual inductance may be done using various known methods. Next, a value for n may be calculated in step 630, as described above, using the measured mutual inductance values. Next, the method places the tuner IC 130 in an operational mode 640, wherein the first current source 230 and the second current source 235 are driven based upon the calculated value of n. The method may then end at 650.

Alternatively, the method 600 may also validate the value of n. This may be done in a manner similar to step 320 above, by selecting a range of values for n about the calculated value of n. Then, increments for the value of n may be used to repeat the steps such as 330-350 to produce a more refined or validated value for n.

Also, as described above for the method 500, during the operation of the tuner IC 130, a recalibration may occur. The same steps may be used.

The embodiments described herein may be expanded and applied to multiple inputs and outputs of the tuner IC 130. Further, while the embodiments described herein describe a tuner IC, the methods and systems may also be applied to other types of ICs and systems that have sensitive inputs/outputs, for example analog inputs and outputs, along with inputs/outputs that may produce interference due to mutual inductance such as for example digital inputs/outputs.

It should be noted that various aspects of the above embodiments may be combined resulting in other embodiments. Also, various steps in the methods may be performed in a different order or simultaneously. Also various aspects of the embodiments above may be implemented using processors and computer instructions to result in a specific machine implementing the embodiment. Also, portions of the embodiments above may be implemented using ASICs or other specific hardware elements.

As used herein, the term "processor" will be understood to encompass a variety of devices such as microprocessors, field-programmable gate arrays (FPGAs), application-specific integrated circuits (ASICs), and other similar processing and computing devices.

It should be appreciated by those skilled in the art that any block diagrams herein represent conceptual views of illustrative circuitry embodying the principles of the invention.

Although the various embodiments have been described in detail with particular reference to certain aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A non-transitory medium comprising instructions configured to execute a method of cancelling cross-talk on IC pin connections of a chip, the non-transitory medium comprising:
   instructions for driving a first current source to produce a first current at a first pair of IC pin connections of the chip;
   instructions for driving a second current source to produce a second current at a second pair of IC pin connections of the chip, wherein n is a ratio of the first and second currents;
   instructions for measuring a voltage at an input/output of the chip when the first and second current sources are driven;
   instructions for repeating the instructions for driving the first current source to produce the first current, the instructions for driving the second current source to produce the second current, and the instructions for measuring the voltage at the input/output of the chip when the first and second current sources are driven for various values of n;
   instructions for determining a value of n that produces a minimum voltage magnitude at the input/output of the chip.

2. The non-transitory medium of claim 1, wherein execution of the method of cancelling cross-talk occurs during a production test.

3. The non-transitory medium of claim 1, wherein execution of the method of cancelling cross-talk occurs only once on a reference sample, while a result of the method of cancelling cross-talk can be used for a large quantity of same or similar samples.

4. The non-transitory medium of claim 1, wherein execution of the method of cancelling cross-talk occurs during an Integrated Circuit (IC) start-up calibration.

5. The non-transitory medium of claim 1, wherein the first and second pairs of IC pin connections are a differential high-speed serial interface (HSSI).

6. The non-transitory medium of claim 1, wherein the input/output of the chip is an RF input/output.

7. A non-transitory medium comprising instructions configured to execute a method of cancelling cross-talk on first, second, third, fourth, and fifth IC pin connections of a chip, the non-transitory medium comprising:
   instructions for determining a first mutual inductance between a first IC pin connection and a fifth IC pin connection;
   instructions for determining a second mutual inductance between a second IC pin connection and a fifth IC pin connection;
   instructions for determining a third mutual inductance between a third IC pin connection and a fifth IC pin connection;
   instructions for determining a fourth mutual inductance between a fourth IC pin connection and a fifth IC pin connection;
   instructions for calculating a current ratio n based upon the first, second, third, and fourth mutual inductances, wherein the current ratio n is a ratio between a first current driven on the first and second IC pin connections and a second current driven on the third and fourth IC pin connections;
   instructions for driving a first current source to produce the first current and a second current source to produce the second current wherein the first and second current have a determined ratio of n;
   instructions for measuring a voltage at the fifth IC pin connection.

8. The non-transitory medium of claim 7, further comprising:
   instructions for adjusting a value of the current ratio n based upon the measured voltage at the fifth IC pin connection so that a magnitude of the measured voltage is minimized.

9. The non-transitory medium of claim 7, wherein execution of the method of cancelling cross-talk occurs during a production test.

10. The non-transitory medium of claim 7, wherein execution of the method of cancelling cross-talk occurs only once on a reference sample, while a result of the method of cancelling cross-talk can be used for a large quantity of same or similar samples.

11. The non-transitory medium of claim 7, wherein execution of the method of cancelling cross-talk occurs during an Integrated Circuit (IC) start-up calibration.

12. The non-transitory medium of claim 7, wherein the first, second, third, and fourth IC pin connections are differential high-speed serial interfaces (HSSIs).

13. An integrated circuit comprising:
   a plurality of Radio Frequency (RF) inputs/outputs;
   an on-chip digital interface including a plurality of IC pin connections with a number of the plurality of IC pin connections being larger than two and larger than the number of the plurality of RF inputs/outputs, wherein an output current from the on-chip digital interface is split into plural parallel paths among the plurality of IC pin connections;
   a plurality of current sources; and
   a controller, wherein the controller is configured to calibrate the integrated circuit by:
   driving the plurality of current sources to produce a plurality of currents on a plurality of parallel paths, wherein n is a plurality of ratios for the output current relative to a plurality of currents;
   measuring voltages at the plurality of RF inputs/outputs of the integrated circuit when the plurality of current sources are driven;
   repeatedly driving the plurality of current sources to produce the plurality of currents on the plurality of parallel paths and repeatedly measuring the voltage at the plurality of RF inputs/outputs of the chip, wherein the plurality of current sources are driven for various values of n; and determining a value of n that produces a voltage magnitude below a predetermined threshold at the input/output of the integrated circuit.

14. The integrated circuit of claim 13, wherein calibration of the integrated circuit occurs during a production test.

15. The integrated circuit of claim 13, wherein the calibration of the integrated circuit occurs only once on a reference sample, while a result of the calibration of the integrated circuit can be used for a large quantity of same or similar samples.

16. The integrated circuit of claim 13, wherein calibration of the integrated circuit occurs during an integrated circuit start-up calibration.

17. An integrated circuit comprising:
a plurality of Radio Frequency (RF) inputs/outputs;
an on-chip digital interface including a plurality of IC pin connections with a number of the plurality of IC pin connections being larger than two and larger than the number of the plurality of RF inputs/outputs, and an output current from the on-chip digital interface is split into plural parallel paths among the plurality of IC pin connections;
a plurality of current sources; and
a controller, wherein the controller is configured to calibrate the integrated circuit by:
determining a plurality of mutual inductances between the plurality of IC pin connections and the plurality of RF inputs/outputs;
calculating a plurality of current ratios n based upon the plurality of mutual inductances, wherein the plurality of current ratios correspond to ratios between a first current driven on a first parallel path and a plurality of currents driven on the plurality of parallel paths;
driving the first current source to produce the first current;
driving a plurality of current sources to produce the plurality of currents, wherein the first current and the plurality of currents have a plurality determined ratios n; and
measuring voltages at the plurality of RF inputs/outputs.

18. The integrated circuit of claim 17, further comprising:
adjusting values of n based upon the measured voltages at the plurality of RF inputs/outputs so that the magnitudes of the measured voltages are minimized.

19. The integrated circuit of claim 17, wherein calibration of the integrated circuit occurs during a production test.

20. The integrated circuit of claim 17, wherein calibration of the integrated circuit occurs only once on a reference sample, while a result of the calibration of the integrated circuit can be used for a large quantity of same or similar samples.

21. The integrated circuit of claim 17, wherein calibration of the integrated circuit occurs during an integrated circuit start-up calibration.

* * * * *